(12) United States Patent
Urciuoli et al.

(10) Patent No.: US 11,630,131 B2
(45) Date of Patent: Apr. 18, 2023

(54) ELECTRICALLY-ISOLATED HIGH-VOLTAGE SENSOR WITH LOW POWER DISSIPATION

(71) Applicant: U.S. Army DEVCOM, Army Research Laboratory, Adelphi, MD (US)

(72) Inventors: Damian P. Urciuoli, Bowie, MD (US); Erik S. Schroen, Pasadena, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 96 days.

(21) Appl. No.: 17/375,394

(22) Filed: Jul. 14, 2021

(65) Prior Publication Data

US 2023/0013103 A1 Jan. 19, 2023

(51) Int. Cl.
*G01R 15/22* (2006.01)
*G01R 19/32* (2006.01)
*H05B 45/18* (2020.01)

(52) U.S. Cl.
CPC ............. *G01R 15/22* (2013.01); *G01R 19/32* (2013.01); *H05B 45/18* (2020.01)

(58) Field of Classification Search
CPC ......... G01R 15/22; G01R 19/32; H05B 45/18
See application file for complete search history.

(56) References Cited

U.S. PATENT DOCUMENTS

| | | | | |
|---|---|---|---|---|
| 4,126,825 A | * | 11/1978 | Houston | G01R 15/22 324/96 |
| 4,933,825 A | * | 6/1990 | Allington | H04B 10/801 323/902 |
| 5,745,233 A | * | 4/1998 | Asada | G01R 15/22 327/63 |
| 6,028,423 A | * | 2/2000 | Sanchez | G01R 31/002 324/96 |
| 6,494,370 B1 | * | 12/2002 | Sanchez | G01R 31/002 235/455 |
| 7,949,025 B2 | * | 5/2011 | Olea | H04B 10/572 372/38.1 |
| 8,233,754 B2 | | 7/2012 | Bohnert et al. | |
| 8,867,929 B2 | | 10/2014 | Dietz et al. | |
| 9,377,490 B2 | | 6/2016 | Wang | |
| 2019/0113570 A1 | * | 4/2019 | Astrauskas | G01R 15/22 |

* cited by examiner

*Primary Examiner* — Steven L Yeninas
(74) *Attorney, Agent, or Firm* — Eric B. Compton

(57) ABSTRACT

Novel electrically-isolated high-voltage sensors are provided which have low power dissipation. The sensors are formed of a circuit comprising first and second portions separated by an electrical isolation boundary with the first portion used for high-voltage, and the second portion for low-voltage. While they are decoupled electrically, they are coupled both optically and magnetically. The first portion comprises an LED which generates an optical signal corresponding to a high-voltage signal across the electrical-isolation boundary. The second portion comprises a photodiode which receives the optical signal emitted from the LED and outputs a corresponding low-voltage electrical signal. A temperature-compensating LED biasing sub-circuit may span both portions and include a temperature sensor, a coupled inductor magnetically coupling the electrical isolation boundary, and a rectifier and filter, to provide a bias to the LED which biases the LED to operate in a substantially-linear manner irrespective of the ambient temperature.

16 Claims, 4 Drawing Sheets

ELECTRICALLY-ISOLATED HIGH-VOLTAGE SENSOR WITH LOW POWER DISSIPATION

GOVERNMENT INTEREST

The invention described herein may be manufactured, used, and licensed by or for the United States Government.

BACKGROUND OF THE INVENTION

I. Field

The field of the invention relates to power sensing, conversion, and more particularly to, novel electrically-isolated high-voltage sensors having low power dissipation.

II. Description of Related Art

Isolated, high-voltage sensing is often accomplished by scaling down or converting a high-voltage signal and magnetically or optically coupling the signal parameter to a circuit having a separate power connection and a separate ground connection. Transformers capable of supporting high-isolation voltage between their windings can be used for AC or chopped DC voltages. However, depending on the isolation voltage required, the transformers can be large. Furthermore, chopping high voltage can be difficult, can introduce signal noise, and can limit sensor bandwidth. Magnetic field sensors using the Hall effect, fluxgate magnetometers, or other techniques may be used to sense magnetic fields from current produced by the high-voltage signal. However, for low-power dissipation, currents must be scaled down to very low values, requiring large flux multiplication and concentration at the sensor. Furthermore, such sensors are susceptible to noise from stray magnetic fields and can require complex magnetic shielding.

Moreover, known optically-coupled high-voltage sensors are quite lossy in terms of power drawn and dissipated from the high-voltage signal. For instance, at voltages up to 30 kV, just 1 mA of current in a light-emitting-diode (LED) optical source can result in nearly 30 W of dissipation in the high-voltage-side circuit of the sensor.

SUMMARY OF THE INVENTION

Novel electrically-isolated high-voltage sensors are provided for and described herein which advantageously have low power dissipation.

According to various embodiments, the sensors are formed of a circuit comprising a first portion and a second portion separated by an electrical isolation boundary. While they are decoupled electrically, they are coupled both optically and magnetically. The first portion is used for high-voltage, and the second portion is for low-voltage.

The first portion comprises a light-emitting diode (LED) which generates an optical signal corresponding to a high-voltage signal across the electrical-isolation boundary. The second portion comprises a photodiode which receives the optical signal emitted from the LED and outputs a corresponding low-voltage electrical signal.

A temperature-compensating LED biasing sub-circuit is provided which may span both portions of the circuit. It includes a temperature sensor, a coupled inductor magnetically coupling the electrical-isolation boundary, and a rectifier and filter, so as to provide a bias to the LED which biases the LED to operate in a substantially linear manner irrespective of the ambient temperature. The temperature sensor may be located in the second portion, and the rectifier and the filter may be located in the first portion.

The high-voltage signal may be up to about 30 kV, for instance, and no more than 1 W is dissipated in the electrically-isolated high-voltage sensor circuit. The LED may draw no more than about 1 µA/kV to produce the optical signal.

The first portion may include an input which receives the high-voltage signal. It may further include another input which receives a calibration signal. And, the second portion may include an output which outputs a signal related to the corresponding low-voltage signal. These may be terminals, whether fixed or removable.

The second portion may also be configured to provide signal filtering, signal offset and gain adjustment, and signal offset and gain temperature compensation to the corresponding low-voltage electrical signal output from the photodiode. More particularly, the second portion may comprise: an optical sensor sub-circuit comprising the photodiode which receives the optical signal emitted from the LED and an amplifier which outputs an amplified current signal corresponding to the received optical signal; an amplifier sub-circuit which converts the current signal from the optical sensor sub-circuit to an inverted voltage signal and provides signal filtering; a resistor network which conditions the output signal of the amplifier sub-circuit to provide gain compensation with respect to temperature; and an inverting-amplifier sub-circuit which inverts, amplifies, and filters the negative-voltage signal from the amplifier sub-circuit to provide a positive output-voltage signal from the sensor.

Moreover, the resistor network may comprise one or more thermistors. The amplifier sub-circuit may comprise a potentiometer or designated resistor configured to provide a resistance that removes an offset in the corresponding electrical signal which is produced by the temperature-compensating LED biasing sub-circuit.

And, more particularly, the temperature-compensating LED biasing sub-circuit may comprise: the temperature sensor in the second portion of the circuit which senses and outputs a current proportional to ambient temperature; a microcontroller in the second portion of the circuit which receives the output current from the temperature sensor and outputs a low-power signal having a predetermined pulse-width correlated to the sensed ambient temperature; the coupled inductor comprising a first winding electrically connected to the first portion of the circuit and a second winding electrically connected to the second portion of the circuit; the rectifier in the first portion of the circuit; and the filter in the first portion of the circuit. The output of the temperature-compensating LED biasing sub-circuit biases voltage and current to the LED with or without the high-voltage signal so that the LED operates in a substantially-linear manner irrespective of the operating temperatures of the LED. With the temperature-compensating LED biasing sub-circuit, the LED may be configured to operate in a substantially linear manner at least between 25° C. to 70° C. The filter of the temperature-compensating LED biasing sub-circuit may comprise: a first low-pass resistor-capacitor (RC) filter stage and a second low-pass resistor-capacitor (RC) filter stage.

These and other embodiments of the invention are described in more detail below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

DETAILED DESCRIPTION

Figure 1:
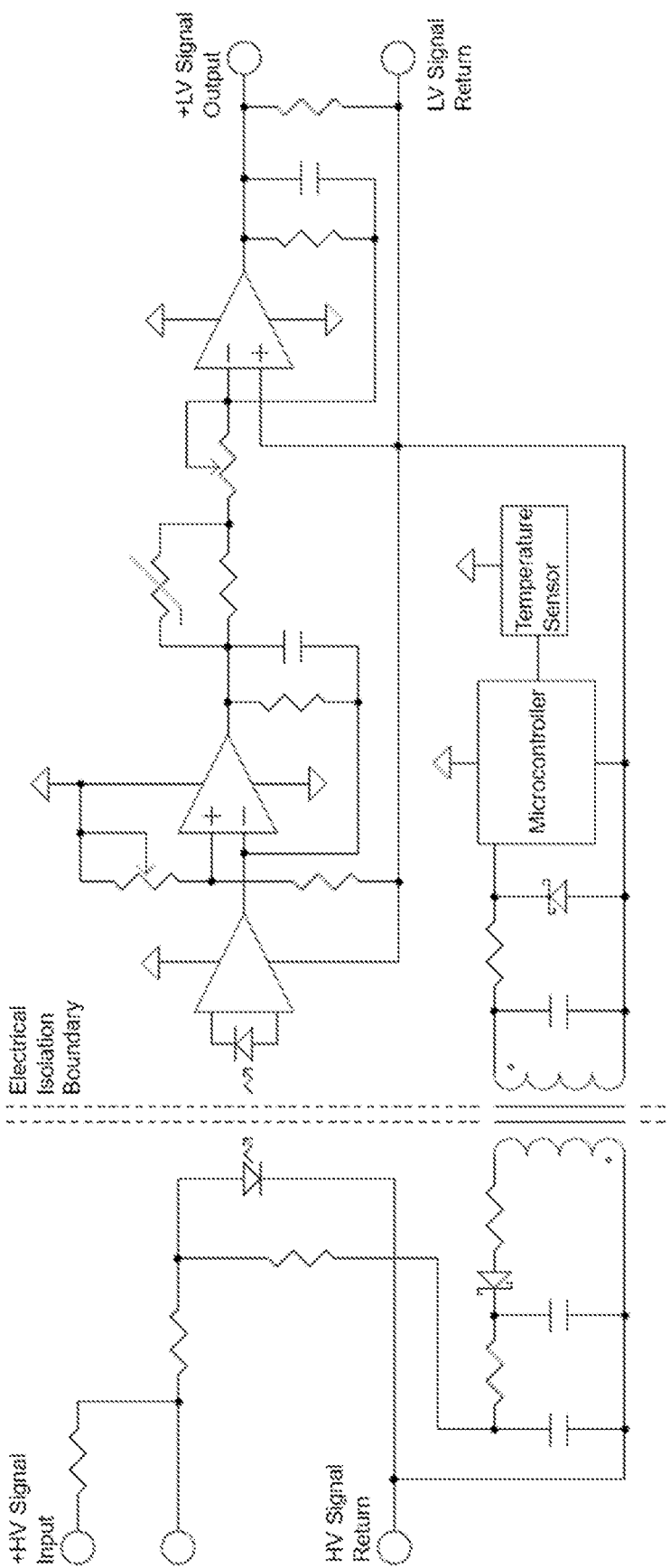
FIG. 1 is a circuit diagram showing an electrically-isolated high-voltage sensor circuit according to an embodiment of the invention.
Figure 2:
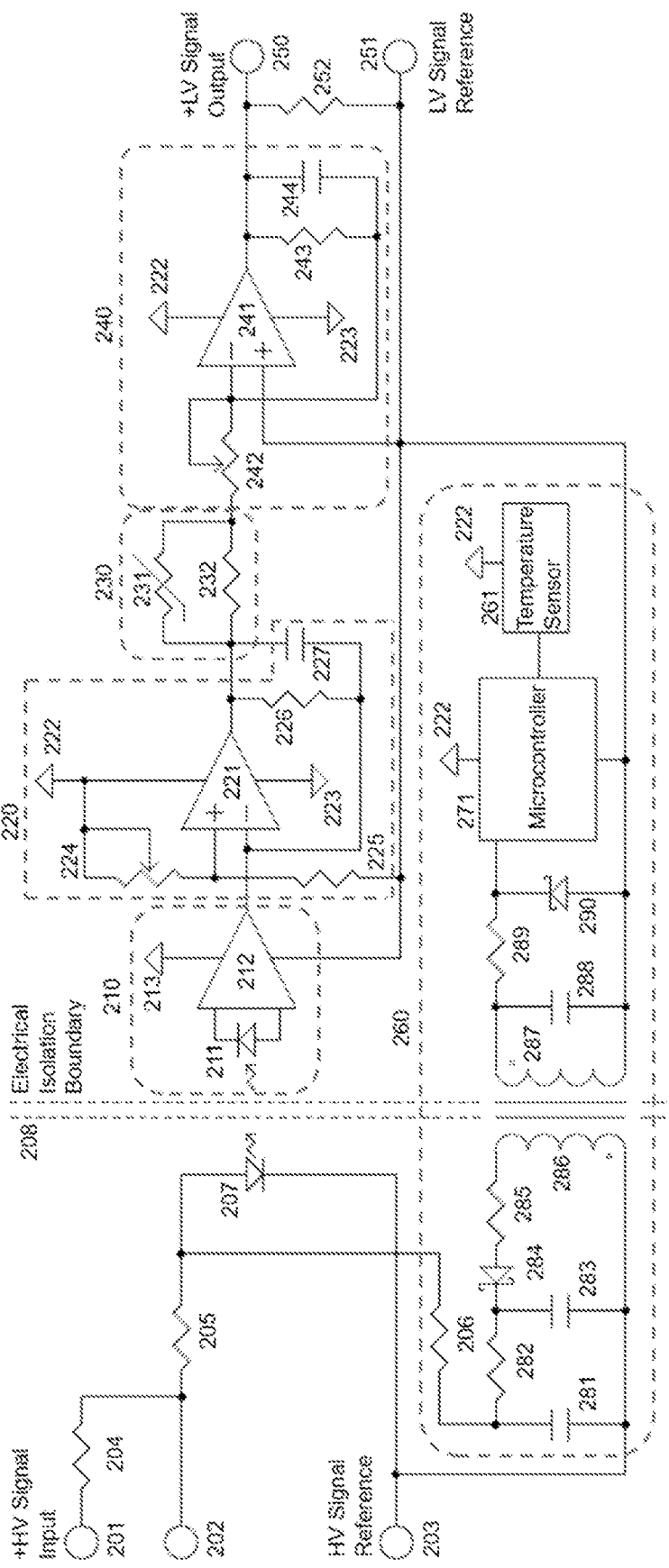
FIG. 2 shows the same circuit diagram of FIG. 1 just with the various sub-circuits and components labeled with reference numerals and sub-circuits thereof delineated.

FIG. 1 shows the circuit diagram of an electrically-isolated high-voltage sensor circuit according to an embodiment of the invention. There are no reference numerals or sub-circuits shown in this figure. This is to give a clear presentation of the overall circuit depicted there. FIG. 2 shows the same circuit diagram of FIG. 1 just with various sub-circuits and components labeled with reference numerals and sub-circuits thereof delineated. Careful selection and design of the components and sub-circuits result in an efficient sensor.

The electrically-isolated high-voltage sensor circuit (200) is a circuit formed of two electrically-isolated portions: a first portion (I) which receives and/or is connected to a high-voltage signal; and a second portion (II) that provides signal filtering, signal offset and gain adjustment, and signal offset and gain temperature compensation, which are separated by an electrical isolation boundary. In FIGS. 1 and 2, this is shown as the electrical isolation boundary (208). This boundary (208) does not permit electrical signals to cross and more specifically blocks the high-voltage signal input at the first portion (I) from reaching the second portion (II) of the circuit. Thus, the first and second portions (I) and (II) of the circuit are decoupled electrically, with the first portion (I) used for high-voltage and the second portion (II) for low-voltage. However, the two electrically-isolated portions of the circuit (I) and (II) are coupled both optically and magnetically.

The sensor circuit (200) allows the measurement of high-voltage signals, for example up to about 30 kV, having a single polarity (unipolar voltages) while drawing a very low current, for example up to 30 µA, from the high-voltage signal source. Despite the high level of voltage, the very low level of current results in a relatively low power, for example less than 1 W, drawn from the high-voltage signal source and thereby dissipated in the high-voltage circuit of the sensor. This allows the high-voltage sensor to be relatively small in size and light in weight. The relatively low power dissipated by the sensor, also enables more accurate measurement of high-voltage signals of lower-power sources. The sensor circuit (200) provides a low-voltage output signal that is proportional to the high-voltage input signal. The sensor may be powered by a low-voltage DC source, for example 5 V, which may be implemented using an external power supply or batteries.

Starting at the first portion (I), the electrically-isolated high-voltage sensor circuit (200) is intended to be connected to a unipolar high-voltage signal with the positive and negative poles of the high-voltage signal connected to the +HV-signal-input terminal (201) and the HV-signal-return terminal (203) of the sensor, respectively. The unipolar high-voltage may be provided by any voltage source, such as, a battery, voltage generator or other source. It may be capable of outputting voltage of up to about 30 kV. So long as it is a unipolar voltage it should never reverse polarity. Typically, the high-voltage will be DC. The negative voltage intervals of pure AC signals will not produce an optical output signal from the LED. But, if AC voltage has a positive DC offset of more than the AC amplitude, an optical signal can be produced from the LED. The return terminal (103) can be grounded in some sensor embodiments/implementations. In others, the sensor may be configured for an isolation voltage of up to 30 kV, for example. So terminals (201) and (203) can be at potentials of up to 30 kV above ground, or the low-voltage signal reference. Also, the potential between terminals (201) and (203) can be up to 30 kV. But both cannot occur at the same time, because terminal (201) would then be 60 kV above ground, or the low voltage signal reference. The terminals (201) and (203) could be fixed (such as with soldering) or permit with, relative ease, simple connection and disconnection (such as with plugs) to the HV source and/or ground.

Between the high-voltage input terminals (201) and (203), a high resistance (204) is connected in series with a calibration resistor (205) and a high-efficiency light-emitting diode (LED) (207). LED (207) for example may be fabricated from indium gallium nitride (InGaN) semiconductor material and be capable of outputting visible light at forward current levels at or below 1 µA. The LED (207) may also, for example, have transparent electrically-insulating encapsulation that provides a narrow viewing angle by focusing the LED light. Furthermore, additional lenses or reflectors for example may be used to provide additional focusing of the light provided by the LED (207). The high resistance (204) represents one or more high-voltage rated, series-connected resistors and may be for example 1 GΩ. The sum of the high resistance (204) and the resistance of the calibration resistor (205) determines the level of current flow through the LED (207) provided by the high-voltage signal for example 1 µA/kV.

However, the resistance of the calibration resistor (205) which may be for example approximately 1 MΩ, is intended to be much smaller than that of the high resistance (204), and therefore has much less of an effect on the LED (207) current provided by the high-voltage signal.

In some embodiments and implementations, an optional calibration-signal input terminal (202) may be provided which allows a unipolar low-voltage signal having its positive pole connected to the calibration terminal (202) and its negative pole connected to the HV-signal-return terminal to be used to calibrate the sensor in the absence of the high-voltage signal. By using a lower-voltage calibration signal, for example up to 30 V, which can be verified by a secondary voltage measurement, using for example a calibrated voltmeter, and having a known calibration resistance (205), the full range of LED current corresponding to the high-voltage-signal range can be produced to verify or adjust the sensor output voltage. Calibration terminal (202) could be a fixed or removable connection.

The LED (207) emits an optical signal from the first portion (I) to the second portion (II) across the optically-transparent electrical-isolation boundary (208). For instance, the LED (207) may output electromagnetic radiation in the visible, IR and/or ultraviolet spectra as the optical signal. The emitted optical signal may be referred to as "light" herein, although it may not be necessarily perceivable with the naked human eye.

Due to ambient temperature variations, the LED (207) may operate in a non-linear manner. In general, as the temperature of the LED (207) increases, the intensity of the electromagnetic radiation (light) emitted by the LED (207) decreases. For instance, the light intensity emitted from one particular model LED used for LED (207) is found to vary over at least a 25° C.-to-70° C. ambient temperature range. This will undoubtedly cause errors in the voltage sensing because of the temperature-varying emissions from the LED (207) across the isolation boundary (108).

Thus, the LED (207) is biased by a temperature-compensating LED biasing sub-circuit (260) so that the LED (207) operates in a substantially-linear manner irrespective of ambient temperature. It spans across the isolation boundary (108) with components in both the first and second portions (I) and (II) of the circuit (200). And it will be discussed further below.

Located on the second portion (II) of the circuit (200), an optical sensor sub-circuit (210) receives the optical signal emitted from the LED (207) and converts it to an electrical-current signal. The optical sensor sub-circuit (210) is a high-sensitivity, high-bandwidth, low-noise, integrated circuit, for example, Analog Devices, Inc.'s model ADPD2211, which comprises a photodiode (211) and a current amplifier (212). The optical sensor (210) may be powered by a voltage lower than 5 VDC, for example, 3.3 VDC, from a conventional voltage regulator (not shown) which can aid in reducing signal noise.

An amplifier sub-circuit (220) converts the current signal output from the optical sensor sub-circuit (210) to an inverted (negative) voltage signal and provides signal filtering. In some embodiments/implementations, the amplifier sub-circuit (220) may be configured as a transimpedance amplifier, as shown, in which it converts an input current to an output voltage. But, because it has a capacitor in the feedback path in parallel with a resistor, the feedback network has an impedance (resistance changing with time). Conventional transimpedance amplifiers generally have the non-inverting input of the operational amplifier (op-amp) connected directly to the supply reference of the input-current source to minimize loading at the input and output of the amplifier. However, in the amplifier sub-circuit (220) shown, the non-inverting input of the op-amp (221) is connected to the supply reference of the input-current source (251) through a resistor (225) that forms an adjustable voltage divider with a potentiometer (224). The adjustable voltage provided by the resistor (225) and the potentiometer (224) between the positive supply voltage (222) of the op-amp (221) and the supply reference of the input-current source (251) allows positive offset to be removed from the signal. For example, a resistor (225) of approximately 50Ω and a potentiometer (224) with a total resistance of 2 kΩ may be used for a positive supply voltage (222) of 5 VDC. A relatively low 50-Ω resistance does not adversely affect the loading at the input and output of the op-amp (221).

The biasing of the LED (207) by the temperature-compensating LED biasing sub-circuit (260), discussed below, effectively produces an offset in the signal output from the optical sensor sub-circuit (210). So it needs to be removed for accurate sensing. The potentiometer (224) in the amplifier sub-circuit (220) provides this function. In some implementations (such as a production model), the potentiometer (224) may be replaced with a designated resistor with a fixed corresponding resistance.

Negative feedback from the output to the inverting input of the op-amp (221) is provided by a resistor (226) and a capacitor (227) connected in parallel. The feedback resistor (226) determines the steady-state gain of the inverted current-to-voltage conversion of the amplifier sub-circuit (220) and may for example have a value of 143 kΩ, resulting in an input-to-output conversion ratio of approximately −143 mV/μA. A negative supply voltage (223) for example of −5 VDC may be used for the op-amp. The feedback capacitor (227) provides a time integration of the input signal. Together with the feedback resistor, the feedback capacitor provides a first-order low-pass filtering of the signal. The feedback capacitor may for example have a capacitance of 5 pF, resulting in a first-order low-pass filter −3-dB cutoff frequency of 223 kHz.

The output signal of the amplifier sub-circuit (220) is conditioned by a resistor network (230) which provides gain compensation with respect to temperature for the inverting-amplifier sub-circuit (240) of the high-voltage sensor. Without the resistor network (230), the sensor output signal would be more non-linear with varying temperature.

The resistor network (230) includes a negative temperature coefficient (NTC) thermistor (231), which may have a nominal resistance at 25° C. of, for example, 100Ω. The resistor (232) may have a resistance of for example 56Ω. The resistance of the NTC thermistor (231) decreases with increasing temperature, thereby reducing the equivalent resistance of the parallel combination of the thermistor (231) and the resistor (232). Reducing the resistance of the resistor network (230) increases the gain of the inverting amplifier sub-circuit (240) as a means of compensating for decreasing light emitted by the LED (207) with increasing temperature for a given LED (207) forward current. The values of the thermistor (231) and the resistor (232) and the resistance-versus-temperature characteristic of the thermistor (231) are selected to provide gain compensation to result in a nearly-linear relationship between the LED (207) forward current and the sensor's low-voltage output signal, over an operating-temperature range of, for example, 25° C. to 70° C. In other embodiments, the resistor network (230) may be implemented with different variations, for example, with different numbers of resistors and thermistors in different series and parallel connections to provide different gain compensation responses with temperature.

The inverting-amplifier sub-circuit (240) inverts, amplifies, and filters the negative-voltage signal from the amplifier sub-circuit (220) to provide a positive output-voltage signal from the sensor. The non-inverting input of the op-amp (241) is connected to the supply reference (251) of the current amplifier (212). The supply reference (251) node also serves as the low-voltage signal reference terminal of the overall sensor output. It could be grounded or unground (such as with a battery-powered low-voltage supply). The connection(s) could be fixed (such as with soldering) or permit with, relative ease, simple connection and disconnection (such as with plugs).

The output signal of the high-voltage sensor is a low-voltage signal ranging between 0 V and 2.5 V. The low-voltage output signal is intended to be proportional to the high-voltage input signal, and more particularly, in a nearly-linear manner. The output-to-input voltage ratio would be ideally 83.33 µV/V.

Adjustable voltage gain in the inverting-amplifier sub-circuit (240) is provided by a potentiometer (242) connected to the feedback resistor (243) at the inverting input of the op-amp (241). Ideally, the magnitude of the steady-state voltage gain provided by the inverting-amplifier sub-circuit (240) is equal to the feedback resistance (243) divided by the resistance in series with the inverting input of the op-amp (241). The resistance in series with the inverting input of the op-amp (241) is equal to the sum of the equivalent resistance of the temperature-compensating resistor network (230) and the resistance setting of the potentiometer (242). For example, the feedback resistor (243) may have a resistance of 165Ω, and the potentiometer (242) may have a total resistance of 200Ω. A feedback capacitor (244) is connected in parallel with the feedback resistor (243). The feedback capacitor (244) provides a time integration of the input signal. Together with the feedback resistor (243), the feedback capacitor (244) provides a first-order low-pass filtering of the signal. The feedback capacitor (244) may for example have a capacitance of 4.7 nF, resulting in a first-order low-pass filter −3-dB cutoff frequency of 205 kHz. The op-amp (241) may be powered, as shown, by the same positive supply (222) and negative supply (223) voltages as the op-amp (221) of the amplifier (220).

The output signal of the high-voltage sensor circuit is a low-voltage signal ranging between about 0 V and 2.5 V. The low-voltage output signal is intended to be proportional to the high-voltage input signal, and more particularly, in a nearly-linear manner. Optionally, the output signal may be loaded, to possibly reduce effects of electromagnetic interference (EMI), by installing an internal resistor (252), which may, for example, have a value of 2 kΩ. The positive low-voltage output signal and its corresponding reference are provided by two pins (250) and (251), respectively of a four-pin connector. The two other pins of the connector (not shown in FIGS. 1 and 2) are used to supply input power to the sensor at 5 VDC. The two first-order low-pass filters provided by the amplifier sub-circuit (220) and the inverting amplifier sub-circuit (240) reduce high-frequency noise while providing a bandwidth of over 100 kHz. From the transfer function applied for two cascaded first-order filter stages having cutoff frequencies of 223 kHz and 205 kHz, respectively, a resultant cutoff frequency of 137 kHz is calculated.

For the LED (207) to provide a nearly-linear optical response to forward current, a current is generated to bias the LED (207) into a nearly-linear operating region. Additionally, because the linearity of the optical-to-forward-current response of the LED (207) is affected by the temperature of the LED (207), the bias current generated for the LED (207) is adjusted to compensate for the LED (207) temperature. At the low forward-current levels at which the LED is operated, self-heating of the LED due to its power dissipation can be assumed to be largely negligible and thus can be neglected.

The temperature-compensating LED biasing sub-circuit (260) is provided which is configured to bias the LED (207) to operate in a substantially-linear manner irrespective of ambient temperature. While the earlier-mentioned sub-circuits and their components where located in either the first portion (I) or second portion (II) of the circuit (200), the sub-circuit (260) spans the first portion (I) and the second portion (II) of the circuit (200) having components in both.

Going from the second portion (II) to the first portion (I) of the circuit, the temperature-compensating LED biasing sub-circuit (260) is formed of a temperature sensor (261) located in the second portion (II) for measuring the ambient temperature. A coupled inductor (having a primary winding (287) in the second portion (II) and a secondary (286) winding in the first portion (I) magnetically couples across the electrical isolation boundary (208). And a rectifier formed of a diode (284) and low-pass resistor-capacitor (RC) filter stages formed of resistors (285, 282) and the capacitors (283, 281) are located in the first portion (I). Together these elements of the sub-circuit (260) are configured to provide a bias to the LED (207) which biases the LED to operate in a substantially-linear manner irrespective of the ambient temperature. These components of the sub-circuit (260) will be further discussed.

The internal temperature of the high-voltage sensor is measured by the temperature sensor (261) and the microcontroller (271) both located in the second portion (II) of the circuit. For example, the temperature sensor (261) may be Analog Devices, Inc.'s model AD592, which provides an output current proportional to temperature from the 5 VDC supply voltage (222). The microcontroller (271), for example may be Microchip Technology, Inc.'s model PIC12F1822 which reads the output of the temperature sensor (261) using an internal analog-to-digital converter and is also powered from the 5-VDC supply voltage (222). The microcontroller (271) generates a low-power pulse-width-modulated (PWM) signal having a predetermined pulse-width correlated to the measured temperature. It is a pulsed DC signal.

The PWM signal provides a means of pushing the low-power signal, related to the sensed temperature, generated directly by the microcontroller (271), across the electrical isolation boundary (208). The signal is then rectified and filtered to smooth it before it is current-limited through a high-resistance resistor (206). The signal is used as a bias to push the LED (207) out of its non-linear response when operated through its threshold region. However, this bias point effectively produces an offset in the input signal that needs to be removed by setting (to a fixed value) potentiometer (224) in the amplifier sub-circuit (220), earlier discussed.

The sub-circuit (260) further includes a resistor (289) which limits the output current from the microcontroller (271) to the primary winding (287) of a coupled inductor (or could be referred to as a transformer). The primary and secondary windings of the coupled inductor may each have for example 300 turns and 500 turns, respectively. The primary winding (287) is located in the second portion (II) of the circuit and the secondary winding (286) is located on the first portion (I) of the circuit.

The capacitor (288) combined with the resistor (289) provides low-pass filtering to the primary winding (287) of the coupled inductor to limit high-frequency electromagnetic interference in the output of the sensor. The diode (290) prevents current in the primary winding (287) of the coupled inductor from imparting voltage stress on the microcontroller signal output during its low-logic level. The resistor (289), and the capacitor (288), may, for example, have values of 1 kΩ and 470 pF, respectively.

The primary (287) and secondary (286) windings of the coupled inductor and the rectifying diode (rectifier) (284) located in the first portion (I) are connected in the same configuration as that of a flyback converter to transfer the signal by magnetic coupling across the electrical isolation boundary (208) to provide a forward bias to the LED (207). Both this diode (284) and the aforementioned diode (290) may, for example, be 1N5711 Schottky diodes.

The current generated through the secondary winding (286) of the coupled inductor is filtered by two low-pass resistor-capacitor (RC) filter stages in the first portion (I) of the circuit. The first low-pass RC-filter stage comprises resistor (285) and capacitor (283), and the second low-pass RC filter stage comprises resistor (282) and capacitor (281). The resistors (285, 282) and the capacitors (283, 281) may for example have values of 20 kΩ and 100 nF, respectively. The rectified and filtered bias signal is present as a DC voltage with negligible ripple voltage across the capacitor (281). The resistor (206), which for example may have a resistance of 100 kΩ, is connected between the capacitor (281) and the anode of the LED (207), to convert the bias voltage to a small forward-bias current to enable the LED (207) to provide a nearly-linear optical response to forward current.

The forward current of the LED (207) provided by the temperature-compensating LED biasing sub-circuit (260) may result in a small amount of additional forward voltage being applied to the LED (207) in response to varying ambient temperature. For voltage signals at the +HV-signal-input terminal (201) that are significantly greater than the low forward voltage of the LED (207) provided by the bias-current generator, the total LED forward current is approximately equal to the sum of the bias current and the current provided by the high-voltage signal through resistors (204) and (205). The sensor may be unable to effectively measure signal voltages less than or equal to the offset-bias voltage; for example, a 3-V offset-bias corresponds to only 0.01% of the 30-kV range of the sensor, and can be neglected in most applications.

It is noted that the terms "nearly-linear," "substantially-linear," and "linear manner" as used herein refer to dependent output parameters, such as LED optical response and sensor output voltage, having proportions of variance with respect to independent input parameters, such as LED forward current and high-voltage input signal, expressed by a coefficient of determination and denoted by $R^2$ greater than or equal to 0.999 for 16 values of the independent variable evenly spaced on a linear scale over the parameter domain.

Figure 3:
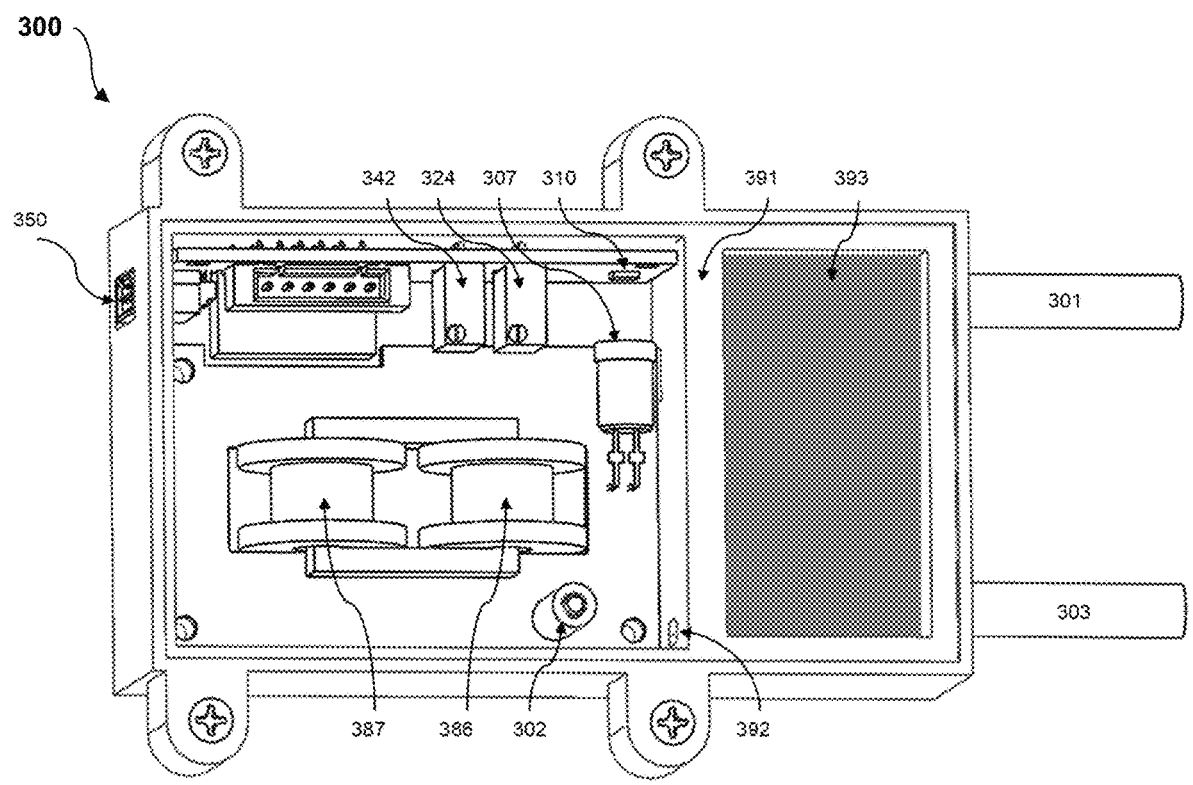
FIG. 3 is a computer aided design (CAD) drawing of an electrically-isolated high-voltage sensor according to an embodiment.

FIG. 3 shows a computer aided design (CAD) drawing of the electrically-isolated high-voltage sensor (300) according to an embodiment. The drawing is shown with its top cover (not shown) having been removed. Salient components and features of the sensor are labeled. The +HV-signal-input terminal (301) and the HV-signal-return terminal (303) of the sensor are implemented with high-voltage insulated wire leads. The calibration-signal input terminal (302) is implemented using a threaded standoff which is covered by the top lid of the sensor when not in use during high-voltage operation of the sensor. The LED (307) is optically coupled to the optical sensor (310). The signal-offset-adjustment (324) and signal-gain-adjustment (342) potentiometers are selected to have side adjustments easily accessible with the top lid of the sensor removed. The input power and output signal terminals are housed together in the low-voltage connector (350). The primary winding (387) and the secondary winding (386) of the coupled inductor are each wound on separate PVC bobbins each encircling a rectangular magnetic core. A partition (391) in the sensor case separates the +HV-signal-terminal (301) and the high-voltage resistors from the low-voltage components of the sensor. A feedthrough hole (392) in the partition allows signal wires to pass though the partition to connect to the rest of the sensor circuitry. The feedthrough hole maybe sealed, with signal wires passing through it, using for example room-temperature-vulcanizing (RTV) material. The high-voltage resistors may be encapsulated to prevent voltage breakdown using for example an opaque insulating epoxy (393) having a high dielectric strength. The compartment of the sensor housing the LED (307), the optical sensor (310) and the coupled inductor is designed to be sealed and filled with a transparent dielectric material, for example a dielectric gel having a relatively hard durometer to passivate component surfaces and to provide a high-voltage isolation barrier between the optically and magnetically isolated circuitry. A stepped edge is designed into the sensor case with a mating feature in the lid to block ambient light from entering into the case and interfering with the optical signal. Additionally, the case is designed to be fabricated using a dark-colored opaque plastic with sufficient thickness to block high levels of ambient light. The case for the CAD drawing has exemplary dimensions of 10.2 cm×8.0 cm×3.3 cm, which makes it small and compact.

As will be appreciated, the circuit (300) might include other sundry elements, like voltage/current measurement displays, heat sinks, fans, plugs, etc. (not shown), as are typical in many power sensing devices.

The electrically-isolated high-voltage sensor as depicted in FIG. 3 was built by the inventors. The circuit built was designed to sense DC voltages up to 30 kV while dissipating less than 1 W from the high-voltage signal. The sensor has electrical isolation with optical and magnetic coupling between components referenced to the high-voltage input signal and low-voltage output signal. The sensor has a scaling factor of 12000:1 and a bandwidth greater than 100 kHz. Correction for signal offset and gain was implemented over a 45° C. temperature range (i.e., 25-70° C.). The sensor's low power dissipation capability and small size result from using a high-efficiency LED as described above. The circuit was evaluated by providing a range of voltages between the calibration terminal (202) and the HV-signal-return terminal (203) to provide a 0-to-30 µA range of calibration currents through the calibration resistor (205) and the LED (207).

Figure 4:
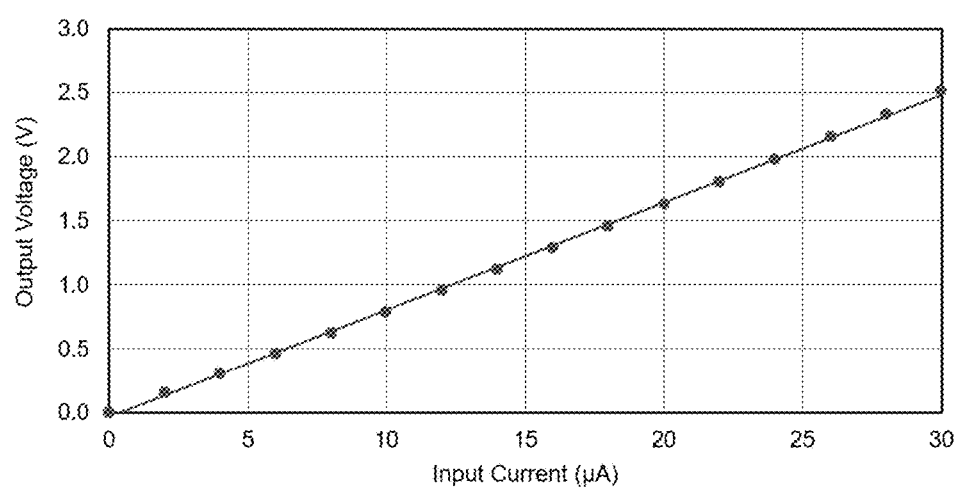
FIG. 4 is a plot of sensor-output voltage versus the input calibration current for an electrically-isolated high-voltage sensor and trend line for an embodiment.

FIG. 4 is a plot showing the sensor-output voltage versus the calibration current for the electrically-isolated high-voltage sensor built and tested. A linear trend line is shown along with the plotted points. The output-voltage-versus-input-current data has a high linear correlation with a coefficient of determination ($R^2$) equal to 0.9995. The small deviation of the output-voltage-versus-input-current data from a linear trend results from the remaining uncompensated electro-optical characteristics of the LED (207). However, the trend could be further linearized by an additional computational process on the sensor output, or in real time by an additional analog adjustable-gain circuit. During testing at ambient temperatures ranging from 25° C. to 70° C., the temperature compensation provided by the temperature-compensating LED biasing sub-circuit (260) and the resistor network (230) resulted in 0.6% variation between output voltages at a calibration-input current of approximately 30 µA.

Components of the low-pass filters in the amplifier sub-circuit (220) and in the inverting amplifier sub-circuit (240) were selected to reduce high-frequency noise while providing a bandwidth of over 100 kHz. The sensor output-voltage attenuation was measured as −0.35 dB at 50 kHz, −1.68 dB at 100 kHz, and −5.29 dB at 200 kHz. These values verify the design criteria with the sensor bandwidth exceeding 100 kHz.

FIGS. 5A-5D are plots showing a sinusoidal voltage with a positive DC offset equal to the sinusoidal voltage amplitude producing 30 µA of peak calibration-input current (Ch3, top trace) and resulting sensor output voltage (Ch2, bottom trace, 1 V/div) at various fundamental frequencies: (a) 10 kHz (40 µs/div) in FIG. 5A, (b) 20 kHz (20 µs/div) in FIG. 5B, (c) 50 kHz (10 µs/div) in FIG. 5C, and (d) 100 kHz (4 µs/div) in FIG. 5D.

Figure 5A:
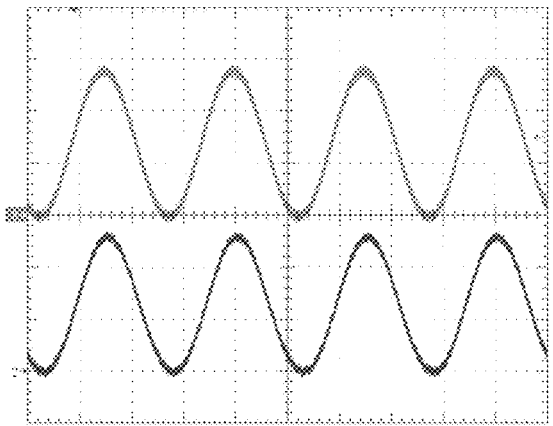
FIGS. 5A-5D are plots showing sensor output voltages for an electrically-isolated high-voltage sensor using a sinusoidal voltage input at 10 kHz (FIG. 5A), 20 kHz (FIG. 5B), 50 kHz (FIG. 5C), and 100 kHz (FIG. 5D).
Figure 5B:
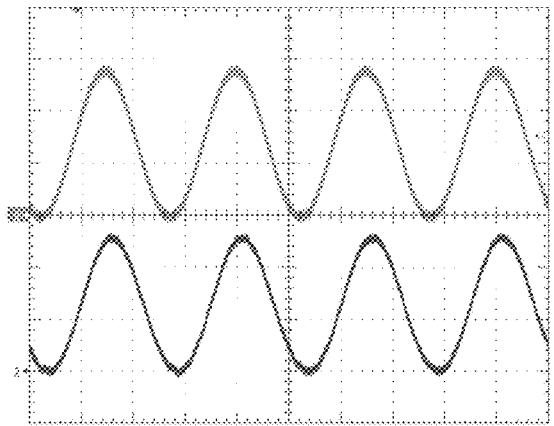
Figure 5C:
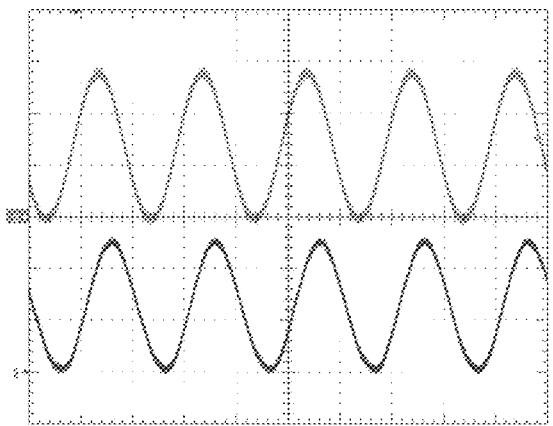
Figure 5D:
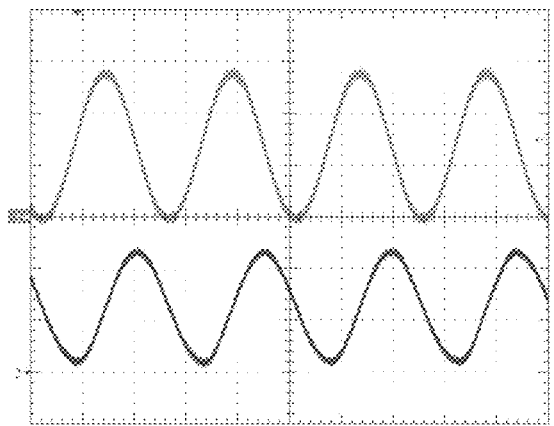

Overall the sensor output-voltage waveforms of FIGS. 5A and 5B have low noise and low distortion. The low-amplitude ripple on the output-voltage waveforms are attributed to residual EMI, after filtering, from the switching power supply providing the +5 VDC (222) and −5 VDC (223) busses of the sensor. Some distortion of the output-voltage is shown in FIGS. 5C and 5D as an asymmetry at the troughs of the waveforms. This is attributed to the inherent capacitance of the diode portion of the LED (207). The output-voltage phase shifts shown in these figures are consistent with those of two cascaded first-order filters.

The electrically-isolated high-voltage sensor technology described herein can be used for diagnostic sensing for commercial high-voltage DC applications including: radar systems, sterilization systems, X-ray machines, combustion system exhaust scrubbers, and air filtration systems.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

We claim:

1. An electrically-isolated high-voltage sensor circuit comprising:
    a first portion located on one side of an electrical isolation boundary comprising:
        a light-emitting diode (LED) which generates an optical signal corresponding to a high-voltage signal across an electrical isolation boundary;
    a second portion located on the other side of the electrical isolation boundary comprising:
        a photodiode which receives the optical signal emitted from the LED and outputs a corresponding low-voltage electrical signal; and
    a temperature-compensating LED biasing sub-circuit comprising a temperature sensor in the second portion for measuring the ambient temperature, a coupled inductor magnetically coupling the electrical isolation boundary, and a rectifier and filter in the first portion, so as to provide a bias to the LED which biases the LED to operate in a substantially linear manner irrespective of the ambient temperature.

2. The sensor circuit according to claim 1, wherein the high-voltage signal comprises an electrical signal up to about 30 kV.

3. The sensor circuit according to claim 2, wherein no more than 1 W is dissipated in the electrically-isolated high-voltage sensor circuit.

4. The sensor circuit according to claim 2, wherein the LED draws no more than about 1 µA/kV to produce the optical signal.

5. The sensor circuit according to claim 1, wherein the first portion comprises an input which receives the high-voltage signal; and the second portion comprises an output which outputs a signal related to the corresponding low-voltage electrical signal.

6. The sensor circuit according to claim 5, wherein the first portion comprises another input which receives a calibration signal.

7. The sensor circuit according to claim 1, wherein the second portion is configured to provide signal filtering, signal offset and gain adjustment, and signal offset and gain temperature compensation to the corresponding low-voltage electrical signal output from the photodiode.

8. The sensor circuit according to claim 7, wherein the second portion comprises:
    an optical sensor sub-circuit comprising the photodiode which receives the optical signal emitted from the LED and an amplifier which outputs an amplified current signal corresponding to the received optical signal;
    an amplifier sub-circuit which converts the current signal from the optical sensor sub-circuit to an inverted voltage signal and provides signal filtering;
    a resistor network which conditions the output signal of the amplifier sub-circuit to provide gain compensation with respect to temperature; and
    an inverting-amplifier sub-circuit which inverts, amplifies, and filters the negative-voltage signal from the amplifier sub-circuit to provide a positive output-voltage signal from the sensor.

9. The sensor circuit according to claim 8, wherein the resistor network comprises one or more thermistors.

10. The sensor circuit according to claim 1, wherein the amplifier sub-circuit comprises a potentiometer or designated resistor configured to provide a resistance that removes an offset in the corresponding electrical signal which is produced by the temperature-compensating LED biasing sub-circuit.

11. The sensor circuit according to claim 1, wherein the temperature-compensating LED biasing sub-circuit comprises:
    the temperature sensor in the second portion of the circuit which senses and outputs a current proportional to ambient temperature;
    a microcontroller in the second portion of the circuit which receives the output current from the temperature sensor and outputs a low-power signal having a pre-determined pulse-width correlated to the sensed ambient temperature;
    the coupled inductor comprising a first winding electrically connected to the first portion of the circuit and a second winding electrically connected to the second portion of the circuit;
    the rectifier in the first portion of the circuit; and
    the filter in the first portion of the circuit,
    wherein the output of the temperature-compensating LED biasing sub-circuit biases voltage and current to the LED with or without the high-voltage signal so that the LED operates in a substantially-linear manner irrespective of the operating temperatures of the LED.

12. The sensor circuit according to claim 10, wherein the LED is configured to operate in a substantially-linear manner at least between 25° C. to 70° C.

13. The sensor circuit according to claim 1, wherein the filter of the temperature-compensating LED biasing sub-circuit comprises: a first low-pass resistor-capacitor (RC) filter stage and a second low-pass resistor-capacitor (RC) filter stage.

14. A high-voltage sensor comprising:
   a housing; and
   a sensor circuit according to claim 1 within the housing.

15. The high-voltage sensor according to claim 14, further comprising:
   a first external terminal which connects to a high-voltage signal; and
   a second external terminal which connects to a high-voltage signal return.

16. An electrically-isolated high-voltage sensor circuit comprising:
   a light-emitting diode (LED) which generates an optical signal corresponding to a high-voltage signal;
   a photodiode which receives the optical signal emitted from the LED and outputs a low-voltage signal; and
   a temperature-compensating LED biasing sub-circuit comprising a temperature sensor for measuring the ambient temperature, a coupled inductor, and a rectifier and filter, so as to provide a bias to the LED which biases the LED to operate in a substantially linear manner irrespective of the ambient temperature.

\* \* \* \* \*